United States Patent
Yamamoto et al.

(10) Patent No.: US 11,510,311 B2
(45) Date of Patent: Nov. 22, 2022

(54) ELECTRONIC COMPONENT MODULE AND METHOD FOR MANUFACTURING ELECTRONIC COMPONENT MODULE

(71) Applicant: Murata Manufacturing Co., Ltd., Kyoto (JP)

(72) Inventors: Issei Yamamoto, Kyoto (JP); Akio Katsube, Kyoto (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 0 days.

(21) Appl. No.: 17/198,489

(22) Filed: Mar. 11, 2021

(65) Prior Publication Data
US 2021/0204395 A1 Jul. 1, 2021

Related U.S. Application Data

(63) Continuation of application No. PCT/JP2019/038252, filed on Sep. 27, 2019.

(30) Foreign Application Priority Data

Sep. 28, 2018 (JP) .............................. JP2018-184682

(51) Int. Cl.
*H05K 1/02* (2006.01)
*H05K 1/18* (2006.01)
*H05K 5/00* (2006.01)

(52) U.S. Cl.
CPC ......... *H05K 1/0216* (2013.01); *H05K 1/0298* (2013.01); *H05K 1/181* (2013.01);
(Continued)

(58) Field of Classification Search
CPC ...... H05K 1/02; H05K 1/0216; H05K 1/0298; H05K 1/18; H05K 1/181–187;
(Continued)

(56) References Cited

U.S. PATENT DOCUMENTS 5,594,204 A * 1/1997 Taylor ................. H05K 5/0269
174/541
8,410,584 B2 * 4/2013 An ...................... H01L 23/3121
257/659

(Continued)

FOREIGN PATENT DOCUMENTS

JP 2018-093014 A 6/2018
WO 2012/023332 A1 2/2012
(Continued)

OTHER PUBLICATIONS

International Search Report for PCT/JP2019/038252 dated Nov. 26, 2019.
Written Opinion for PCT/JP2019/038252 dated Nov. 26, 2019.

*Primary Examiner* — Tuan T Dinh
(74) *Attorney, Agent, or Firm* — Pearne & Gordon LLP (57) ABSTRACT

An electronic component module (100) includes a module board (10) having electronic components (40) mounted on at least one of a first surface (front surface) (12) and a second surface (back surface) (14), mold portions (22 and 23), and a shield (32). The mold portions (22 and 23) cover the mounted electronic components (40). The shield (32) covers at least a part of the mold portions (22 and 23) and the side surfaces of the module board (10). Protrusions (15) protruding from the side surfaces are formed on the module board (10). The shield (32) is separated by the protrusions (15).

20 Claims, 10 Drawing Sheets (52) U.S. Cl.
CPC ... *H05K 5/0034* (2013.01); *H05K 2201/0715* (2013.01); *H05K 2201/10098* (2013.01); *H05K 2201/10545* (2013.01)

(58) Field of Classification Search
CPC .. H05K 5/00; H05K 5/0034; H01L 21/41817; H01L 21/486; H01L 21/561; H01L 23/31; H01L 23/3121; H01L 23/498; H01L 23/49805; H01L 23/49827; H01L 25/50
USPC ............... 361/760, 764, 795, 816, 818; 257/659–730, 787–790; 174/520
See application file for complete search history.

(56) References Cited

U.S. PATENT DOCUMENTS

| | | | |
|---|---|---|---|
| 9,935,083 B2 | 4/2018 | Lee et al. | |
| 9,966,343 B2* | 5/2018 | Kawabata | H01L 25/50 |
| 10,756,024 B2* | 8/2020 | Kitazaki | H01L 23/49827 |
| 2007/0274059 A1* | 11/2007 | Raghuram | G06F 1/20 |
| | | | 361/818 |
| 2011/0115059 A1* | 5/2011 | Lee | H01L 21/561 |
| | | | 257/659 |
| 2013/0155639 A1 | 6/2013 | Ogawa et al. | |
| 2017/0221835 A1 | 8/2017 | Yoo et al. | |
| 2017/0323838 A1 | 11/2017 | Otsubo et al. | |
| 2018/0159216 A1 | 6/2018 | Kai et al. | |
| 2019/0289758 A1 | 9/2019 | Furuya | |
| 2019/0318973 A1 | 10/2019 | Okada et al. | |

FOREIGN PATENT DOCUMENTS

| | | |
|---|---|---|
| WO | 2016/121491 A1 | 8/2016 |
| WO | 2018/110397 A1 | 6/2018 |
| WO | 2018/123382 A1 | 7/2018 |

\* cited by examiner

ELECTRONIC COMPONENT MODULE AND METHOD FOR MANUFACTURING ELECTRONIC COMPONENT MODULE

CROSS REFERENCE TO RELATED APPLICATION

This is a continuation of International Application No. PCT/JP2019/038252 filed on Sep. 27, 2019 which claims priority from Japanese Patent Application No. 2018-184682 filed on Sep. 28, 2018. The contents of these applications are incorporated herein by reference in their entireties.

BACKGROUND OF THE DISCLOSURE

Field of the Disclosure

The present disclosure relates to an electronic component module and a method for manufacturing an electronic component module, and more specifically to a shielding technology in a device in which electronic components are mounted on both surfaces of a board.

Description of the Related Art

An electronic device (module) in which electronic components are mounted on both surfaces of a board has been known. In such a module, electromagnetic waves are radiated to the outside from the mounted electronic components, or the electromagnetic waves reach from the outside. Thus, an operation of the module may be influenced.

As a method for suppressing the influence of such electromagnetic waves, a technology for suppressing the leaking of the electromagnetic waves generated in the electronic components to the outside of the electronic device or the reaching of the electromagnetic waves from the outside by covering a periphery of the electronic device with a shield is adopted.

U.S. Pat. No. 9,935,083 (Patent Document 1) discloses a configuration of an electronic device having electronic components such as semiconductors mounted on both surfaces of a board. In the configuration, electromagnetic interference (EMI) is suppressed by molding the electronic components on the board with resin and forming a shield in the periphery of the molded board.

In the configuration disclosed in U.S. Pat. No. 9,935,083 (Patent Document 1), the electromagnetic waves generated in the electronic components in the electronic device can be prevented from being radiated to the outside by the shield, and the influence of the electromagnetic waves from the outside on the mounted electronic components can be reduced.

Patent Document 1: U.S. Pat. No. 9,935,083

BRIEF SUMMARY OF THE DISCLOSURE

On the other hand, as in U.S. Pat. No. 9,935,083 (Patent Document 1), in the case of the configuration in which the electronic components are mounted on both the surfaces of the board and the entire board including any surface of both the surfaces and a plurality of side surfaces connecting both the surfaces is covered with the shield, there is a possibility that the electromagnetic waves radiated from the electronic components mounted on one surface (front surface) of the board are transmitted to the other surface (back surface) of the board with the shield disposed in the periphery of the board interposed therebetween and influence on the electronic components on the back surface side.

The present disclosure has been made to solve such a problem, and an object thereof is to provide a shield structure capable of effectively suppressing the influence of electromagnetic waves in an electronic component module in which electronic components are mounted on both surfaces of a board.

An electronic component module according to the present disclosure includes a module board, electronic components, mold portions, and a shield. The module board has a first surface, a second surface facing the first surface, and side surfaces connecting the first surface and the second surface. The electronic components are mounted on at least one of the first surface and the second surface. The mold portions cover the electronic components. The shield covers at least a part of the mold portions and the side surfaces. Protrusions protruding from the side surfaces of the module board are formed on the module board. The shield is separated by the protrusions.

In the electronic component module according to the present disclosure, it is possible to prevent the electromagnetic waves radiated from the device disposed on the front surface side of the board from being transmitted to the electronic components mounted on the back surface with the shield interposed therebetween. Accordingly, in the electronic component module in which the electronic components are mounted on the board, the influence of the electromagnetic waves can be effectively suppressed.

BRIEF DESCRIPTION OF THE SEVERAL VIEWS OF THE DRAWINGS

Each of FIGS. 12A, 12B and 12C is a first diagram illustrating the details of the manufacturing process.

Each of FIGS. 13A, 13B and 13C is a second diagram illustrating the details of the manufacturing process.

Each of FIGS. 14A, 14B and 14C is a third diagram illustrating the details of the manufacturing process.

DETAILED DESCRIPTION OF THE DISCLOSURE

Hereinafter, embodiments of the present disclosure will be described in detail with reference to the drawings. The same or corresponding portions in the drawings are designated by the same reference symbols and the description thereof will not be repeated.

First Embodiment

[Configuration of Electronic Component Module]

Figure 1:
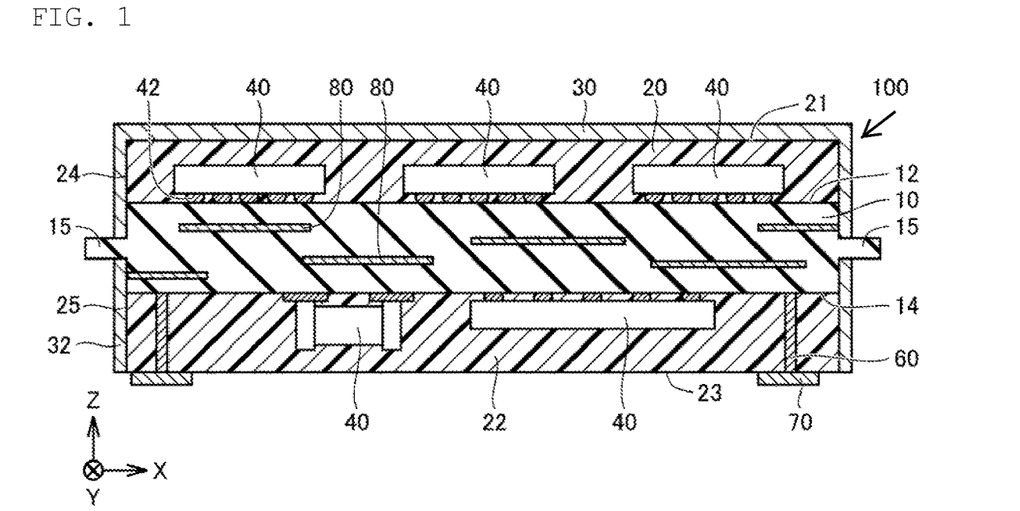
FIG. 1 is a sectional view of an electronic component module according to a first embodiment.

FIG. 1 is a sectional view of an electronic component module 100 according to a first embodiment. Referring to FIG. 1, the electronic component module (hereinafter, also simply referred to as a "module") 100 includes a module board 10, electronic components 40, mold portions 20 and 22, and shields 30 and 32. In the following description, a positive direction of a Z-axis in FIG. 1 may be referred to as an upper surface side, and a negative direction may be referred to as a lower surface side.

The module board 10 has a multi-layer structure, and is formed by a resin board such as a glass epoxy resin or a liquid crystal polymer, or a ceramic board such as low temperature co-fired ceramics (LTCC). Conductor patterns 80 for forming wiring patterns, ground electrodes, inductors, or capacitors are formed inside the module board 10. A conductive material such as copper (Cu), silver (Ag), gold (Au), or a compound of these metals is used as the conductor pattern 80. If necessary, the conductor patterns 80 are electrically connected to each other with vias (not illustrated) interposed therebetween. The conductor patterns 80 are electrically connected to the electronic components 40 mounted on the module board 10 with vias (not illustrated) interposed therebetween.

Electrode terminals (not illustrated) are formed on a front surface (first surface) 12 and a back surface (second surface) 14 of the module board 10, and the electronic components 40 are mounted on the electrode terminals by using solder bumps 42. The electronic component 40 is, for example, a semiconductor element, a ceramic laminated chip component, a resistor component, a transformer, or the like. These electronic components 40 are mounted, and thus, the module 100 can function as, for example, a high frequency module such as a Bluetooth (registered trademark) module, a wireless LAN module, and an antenna module.

The electronic components 40 mounted on both the surfaces of the module board 10 are covered with the mold portions 20 and 22 which are formed by filling resin, respectively. The electronic components 40 mounted on the front surface 12 of the module board 10 are covered with the mold portion 20 (first mold portion), and the electronic components 40 mounted on the back surface 14 are covered with the mold portion 22 (second mold portion). For example, an epoxy resin containing a silica filler can be used as the molding resin.

A plurality of electrode terminals 70 is formed on a surface 23 of the mold portion 22 opposite to a surface on the module board 10 side. The module 100 is mounted on a mounting board (not illustrated) by the electrode terminals 70. The electrode terminals 70 are electrically connected to the module board 10 through columnar conductors 60 formed by using a conductive member such as copper. A power or signals are transmitted to the electronic components 40 mounted on the module board 10 with the columnar conductors 60 interposed therebetween. The electronic components 40 mounted on the module board 10 are connected to a ground potential of the mounting board with the columnar conductors 60 interposed therebetween. The columnar conductors 60 may be formed by using protruding electrodes, metal pins, plating, or the like. Alternatively, the columnar conductors may be connected by using the solder bumps.

An upper surface 21 and side surfaces 24 of the mold portion 20 (surfaces of the mold portion 20 that connect the upper surface 21 of the mold portion 20 and a surface on the module board 10 side) are covered with the shield 30 (first shield) formed by using a conductive material. Side surfaces 25 of the mold portion 22 (surfaces of the mold portion 22 that connect the lower surface 23 of the mold portion 22 and a surface on the module board 10 side) are covered with the shield 32 (second shield) also formed by using a conductive material. Although not illustrated in FIG. 1, the shields 30 and 32 are connected to an external ground potential (for example, a ground potential of the mounting board on which the module 100 is mounted) with the ground electrode and the columnar conductors 60 formed inside the module board 10 interposed therebetween. In FIG. 1, the shield 32 is formed only on the side surfaces of the mold portion 22, but may be further formed on the lower surface 23 of the mold portion 22 where the electrode terminal 70 is not formed.

In the module 100 according to the first embodiment, protrusions 15 protruding from the side surfaces of the module board 10 in an X-axis direction of FIG. 1 are formed over the whole circumference of the side surfaces. The shield 30 that covers the mold portion 20 and the shield 32 that covers the mold portion 22 are separated by the protrusions 15. The protrusions 15 are formed at positions having the same distance from the front surface 12 on the side surfaces of the module board 10. In other words, distances between the front surface 12 and the surfaces of the protrusions 15 in contact with the side surfaces of the module board 10 are equal on the side surfaces.

The shields 30 and 32 prevent electromagnetic waves radiated from the electronic components 40 mounted on the module board 10 from leaking to the outside of the module 100, and prevent the electromagnetic waves from the outside of the module 100 from reaching the outside of the module. That is, EMI can be suppressed by forming the shields 30 and 32 around the module.

As a configuration of the shield for preventing EMI on the board on which the electronic components are mounted on both the surfaces, it is considered that the whole board is covered with one common shield as disclosed in U.S. Pat. No. 9,935,083 (Patent Document 1). However, in such a configuration, although it is possible to suppress the radiation and reaching of the electromagnetic waves to the outside of the module, there is a possibility that the electromagnetic waves radiated from the electronic components formed on one surface (front surface) of the board pass through the shield, propagate to the other surface (back surface), and influence the electronic components on the back surface side.

On the other hand, in the module 100 of the first embodiment, as described above, the shield 30 formed on the front surface 12 side of the module board 10 and the shield 32 formed on the back surface 14 side of the module board 10 are separated by the protrusions 15 formed on the module board 10. With such a configuration, since the electromagnetic waves radiated from the electronic components 40 mounted on one surface (for example, the front surface 12) of the module board can be prevented from propagating to the shield 32 on the back surface 14 side through the shield 30, it is possible to suppress the influence of the electromagnetic waves radiated from the electronic components 40 mounted on one surface of the module board 10 on the electronic components mounted on the other surface. At this time, the shield 30 and the shield 32 are physically separated by the protrusions 15, and thus, the insulation between the two shields can be more reliably secured than when these two shields are separated without using the protrusions 15. Thus, it is possible to more reliably suppress the influence of the electromagnetic waves radiated from the electronic components on the electronic components mounted on both the surfaces of the module board 10.

When the shield 30 and the shield 32 are to be separated without using the protrusions 15, there is a concern that the shield 30 and the shield 32 are electrically connected and short-circuited depending on a distance between an end of the shield 30 and an end of the shield 32. However, the shield 30 and the shield 32 are physically separated by the protrusions 15 as in the first embodiment, and thus, the two shields 30 and 32 can be prevented from being electrically connected on an outer circumference of the module 100.

(Variation of Shield Shape)

In the module 100 in FIG. 1 described above, the shields 30 and 32 are configured to extend to positions in contact with the protrusions 15 on the side surfaces of the module board 10. In other words, portions of the side surfaces of the module board 10 other than the protrusions 15 are covered with the shield 30 or the shield 32. However, the shields 30 and 32 may cover at least the side surfaces of the mold portions 20 and 22 in the module 100.

Hereinafter, a modification example of the shield shape formed on the side surfaces of the module board 10 will be described with reference to FIGS. 2 to 5. In FIGS. 2 to 5, partial sectional views near the side surfaces of the module are illustrated.

Figure 2:
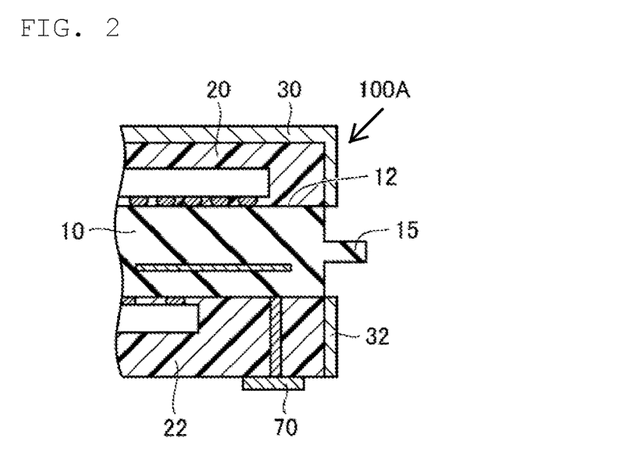
FIG. 2 is a diagram illustrating a first modification example of a shield shape.

In an example of a module 100A illustrated in FIG. 2, the side surfaces of the mold portions 20 and 22 are covered with the shields 30 and 32, but the side surfaces of the module board 10 are not covered with the shields 30 and 32. As stated above, the side surfaces of the module board 10 may not be covered with the shields. In an example of a module 100B illustrated in FIG. 3, the side surfaces of the module board 10 are partially covered with shields 30 and 32.

The electromagnetic waves generated in the electronic components 40 mounted on the front surface 12 side of the module board 10 pass through the mold portion 20 and are radiated. Thus, the shield 30 is formed so as to cover at least the mold portion 20, and thus, the radiation of the electromagnetic waves from the electronic component 40 to the outside of the module 100A is suppressed.

Figure 3:
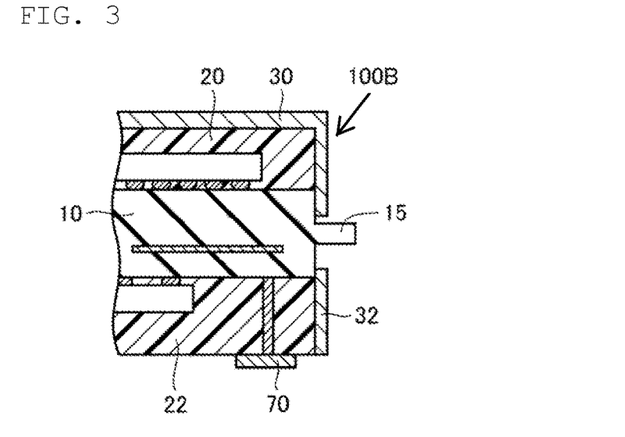
FIG. 3 is a diagram illustrating a second modification example of the shield shape.

Since a part of the electromagnetic waves generated in the electronic components 40 can be radiated even though the electromagnetic waves pass through the module board 10, the configuration of the module 100 of FIG. 1 in which the shield is provided on a wider region on the side surface of the board can obtain a larger shielding effect than the configuration of the module 100A or the module 100B. However, the electromagnetic waves radiated from the module board 10 are attenuated by the ground electrode or the like formed in the module board 10, and as a result, the amount of attenuation increases. Accordingly, the influence of not covering the side surfaces of the module board 10 is relatively small.

When at least a part of the side surface of the module board 10 is covered with the shield 30 or the shield 32 as in the module 100 and the module 100A, the shielding effect can be obtained also for the conductor pattern among the conductor patterns 80 formed inside the module board 10 overlapping the shields 30 and 32 when the side surface of the module board 10 is viewed in plan view from a side on which the protrusion 15 is present. That is, it is possible to prevent electromagnetic wave interference from the outside from reaching the conductor patterns 80 inside the module board 10 indirectly covered with the shields 30 and 32.

Figure 4:
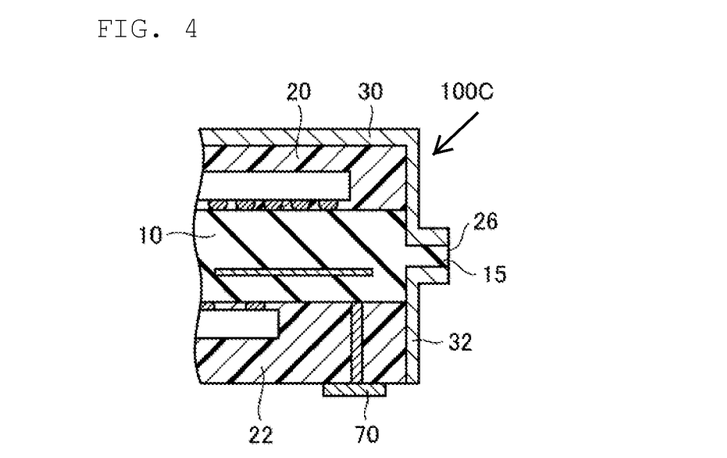
FIG. 4 is a diagram illustrating a third modification example of the shield shape.

In a module 100C illustrated in FIG. 4, the upper surface side and the lower surface side of the protrusion 15 are further covered with the shields 30 and 32 in addition to the side surfaces of the module board 10. Even in this case, an end surface 26 of the protrusion 15 (a surface of the protrusion 15 that connects the surfaces in contact with the side surfaces of the module board 10) is not covered with either the shield 30 or 32. In such a configuration, the electromagnetic waves radiated through the protrusion 15 can be further reduced. The shield covering the protrusion 15 may not be necessarily on both the upper surface side and the lower surface side. That is, at least a part of the surface of the protrusion 15 in contact with the side surfaces of the module board 10 may be covered with the shield 30 or the shield 32.

In the case of such a configuration, it is more preferable that a thickness of the shield formed on the protrusion 15, that is, the shield covering at least one of the surfaces of the protrusion 15 in contact with the side surfaces of the module board 10 (dimension in a Z-axis direction) is more than a thickness of the shield formed on the side surface portion of the module board 10 (dimension in the X-axis direction). As will be described later, in a manufacturing process of the module, when chips of adjacent modules are separated, the portion of the protrusion 15 is cut by a dicing saw. At this time, when the rigidity of the shield formed on the protrusion 15 is weak, there is a concern that the protrusion 15 and the shield are peeled off or the protrusion 15 itself may be broken when the module is separated. Thus, the rigidity of the shield and the protrusion 15 itself is improved by setting the thickness of the shield formed on the protrusion 15 to be more than the thickness of the shield on the side surface of the module board 10. Accordingly, in a step of individually separating the modules, it is possible to prevent the shield from being peeled off from the protrusion 15 and/or the protrusion 15 from being broken.

Figure 5:
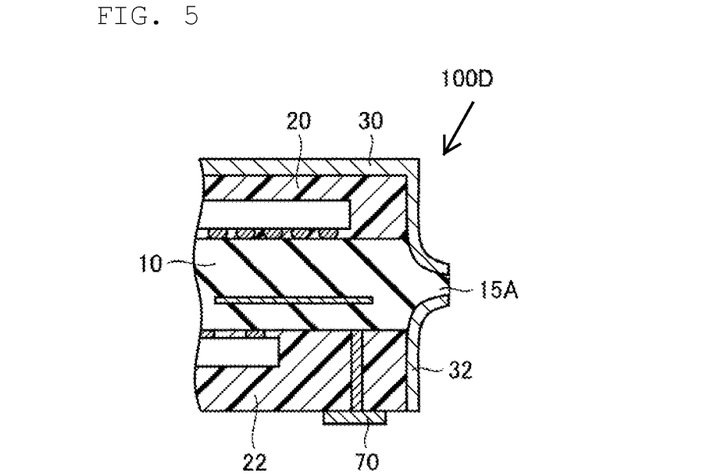
FIG. 5 is a diagram illustrating a fourth modification example of the shield shape.

In a module 100D in a modification example of FIG. 5, a shape of a protrusion 15A formed on the side surface of the module board 10 is different from that of the protrusion 15 of FIGS. 1 to 4. More specifically, the protrusion 15A does not have a shape that protrudes substantially vertically from the side surface of the module board 10, but has a shape in which the thickness of the protrusion (dimension in the Z-axis direction) gradually decreases. The protrusion 15A is formed in such a shape, and thus, it becomes easy to form the shield 30 continuously from the side surface of the module board 10 to the upper surface side or the lower surface side of the protrusion 15A.

In general, the shield 31 and the shield 32 are often formed by using a sputtering method. When the sputtering method is used, it is difficult for a shield film to be formed on a portion at which a corner is formed. Specifically, when the corner is formed at the portion of the protrusion 15 in contact with the side surface of the module board 10 as in the modules 100A to 100C, it is difficult for the shield film to be formed to the contact portion, and it is conceivable that the shield 30 and the shield 32 are interrupted between the side surface of the module board 10 and the protrusion 15.

On the other hand, according to the configuration of the module 100D illustrated in FIG. 5, the corner is not formed at the portion of the protrusion 15A in contact with the side surface of the module board 10, and a gentle curved surface is formed between the side surface of the module board 10 and the protrusion 15A. Thus, the shield 30 and the shield 32 formed by the sputtering method are easily formed evenly from the side surface of the module board 10 to the protrusion 15A, and the shield 30 and the shield 32 are easily formed continuously between the side surface of the module board 10 and the protrusion 15A. Accordingly, the reliability of the shield 30 and the shield 32 is improved, and it is easy to connect the ground electrode or the like formed inside the module board 10 to the shields 30 and 32.

Even though the shape of the protrusion 15A is as illustrated in FIG. 5, when the shield 30 and the shield 32 are separated by the protrusion 15A, the electromagnetic waves generated in the electronic components 40 on the front surface 12 side can be suppressed from propagating to the electronic components 40 on the back surface 14 side with the shields 30 and 32 interposed therebetween.

(Method of Grounding Shield)

The shields 30 and 32 are generally connected to the ground potential in order to prevent the electromagnetic waves captured by the shields 30 and 32 from being re-radiated from the shields 30 and 32. As described with reference to FIG. 1, ground electrodes GND connected to an external ground potential are formed inside the module board 10 having the multi-layer structure with the columnar conductors 60 interposed therebetween. In the first embodiment, when the shields 30 and 32 are formed, the ground electrodes GND are formed such that the shields 30 and 32 and the ground electrodes GND inside the module board 10 are connected on the side surface of the module board 10. Accordingly, since it is not necessary to dispose the wiring or the like for connecting the ground electrodes GND and the shields 30 and 32 on the front surface 12 or the back surface 14 of the module board 10, it is possible to easily connect the shields 30 and 32 to the ground potential without narrowing the spaces on the front surface and the back surface of the module board 10.

Figure 6:
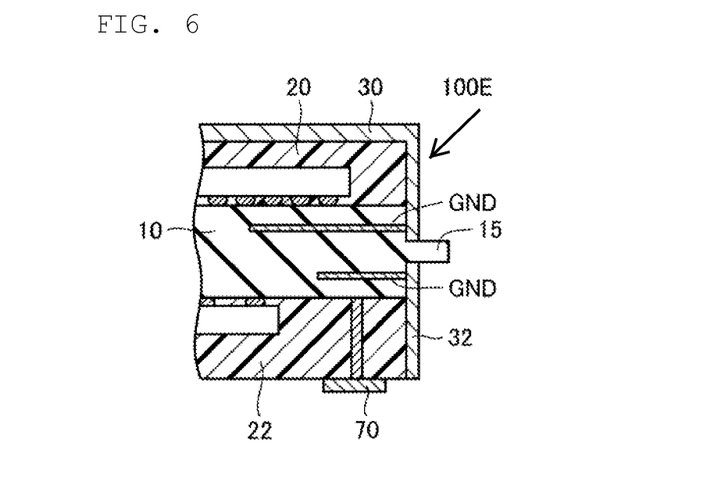
FIG. 6 is a diagram illustrating a first connection example of a shield and a ground electrode formed inside a module board.

FIG. 6 is a partial sectional view of a module 100E illustrating a first connection example of the ground electrodes GND and the shields 30 and 32 formed inside the module board 10. In FIG. 6, the shields 30 and 32 are formed on the whole side surfaces of the module board 10 except for the portion of the protrusions 15 as illustrated in FIG. 1. The ground electrodes GND are formed so as to be exposed from the side surfaces of the module board 10 before the shields 30 and 32 are formed.

More specifically, in a step of forming the module board 10, the ground electrodes GND are formed in layers different from a layer on which the protrusion 15 is formed, and are formed such that the ends thereof are at positions protruding in the directions of the protrusions 15 from the positions of the side surfaces of the module board 10. Accordingly, the ground electrodes GND are exposed on the side surfaces of the module board 10 by performing half-cutting by using a dicer. Thereafter, the shields 30 and 32 are formed so as to cover at least a part of the side surfaces of the module board 10, and thus, the ground electrodes GND formed inside the module board 10 and the shields 30 and 32 are electrically connected.

In FIG. 6, an example is illustrated in which the ground electrode GND is formed in a layer between the layer on which the protrusion 15 is formed and the front surface 12 or the back surface 14 of the module board 10. The layers on which the ground electrodes GND are formed are not limited to the configuration illustrated in FIG. 6, and may be formed so as to overlap a root portion of the protrusion 15 on the side surface of the module board 10, that is, a boundary portion between the side surface of the board 10 and the protrusion 15 as in an example of a module 100F illustrated in FIG. 7.

Figure 7:
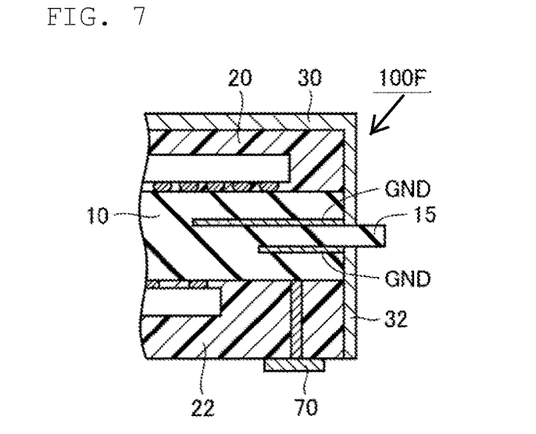
FIG. 7 is a diagram illustrating a second connection example of the shield and the ground electrode formed inside the module board.

According to the configuration of the module 100F, the peeling of the shield 30 and the shield 32 on the side surface of the module board 10 can be suppressed. As with the shield 30 and the shield 32, the ground electrode GND formed by using a conductive material has higher adhesion to the shield 30 and the shield 32 than the protrusion 15 formed by using an insulating material. For example, in the module 100E in which the shield 30 and the shield 32 reach the root portion of the protrusion 15 and the ground electrodes GND are separated from the root portion of the protrusion 15, there is a concern that the shield 30 and the shield 32 are peeled off with the root portion of the protrusion 15 as a start point. On the other hand, in the module 100F, since the ground electrodes GND having high adhesion to the shield 30 and the shield 32 are disposed at the root portion of the protrusion 15, such peeling can be easily suppressed.

Figure 8:
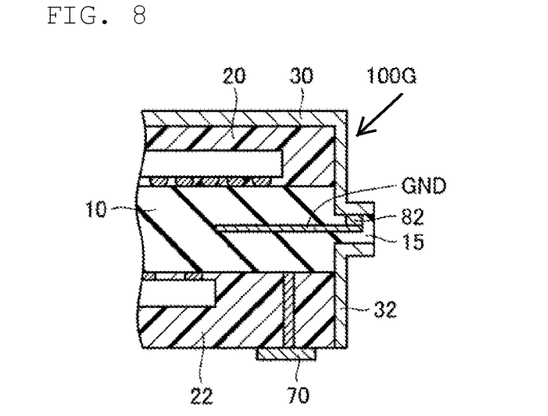
FIG. 8 is a diagram illustrating a third connection example of the shield and the ground electrode formed inside the module board.

In the configuration in which the shields are also formed on the upper surface side and the lower surface side of the protrusion 15 described in FIG. 4, the ground electrode GND and the shield may be connected in the portion of the protrusion 15 with a via 82 interposed therebetween as illustrated in an example of a module 100G in FIG. 8. In this case, in a step of forming the module board 10, the ground electrode GND is formed in the layer on which the protrusion 15 is formed such that the end thereof is positioned inside the protrusion 15. The via 82 is formed from the end of the ground electrode GND in the direction of the front surface 12 (or the direction of the back surface 14) of the module board 10.

In a step of performing the half-cutting by using the dicer, the shields 30 and 32 are formed after the module board 10 is cut until the via 82 is exposed. Accordingly, the shields 30 and 32 are connected to the ground electrode GND with the via 82 interposed therebetween.

According to the configuration of the module 100G, the connectivity between the ground electrode GND inside the module board 10 and the shield 30 is improved.

For example, in the configuration of the modules 100E and 100F in which the ground electrodes GND are connected to the shield 30 and the shield 32 on the side surfaces of the module board 10, the ground electrodes GND are formed so as to be exposed on the side surfaces of the module board 10 by the half-cutting step by using the dicer as will be described later in the description of manufacturing process of FIGS. 12A to 14C. At this time, surfaces exposed on the side surfaces of the module board 10 at the ground electrodes GND come into contact with a side surface of a blade of a dicing saw. The blade of the dicing saw gradually wears as a cutting operation is continued, and machinability deteriorates especially on the side surface of the blade. When the half-cutting is performed by such a worn dicing saw, since the module board corresponding to the portion where the machinability of the blade of the dicing saw deteriorates (the portion of the side surface of the blade) remains without being cut, there is a possibility that the ground electrodes GND are not thoroughly exposed to the side surfaces of the module board 10. The connectivity between the ground electrodes GND and the shield 30 and the shield 32 deteriorates.

On the other hand, in the configuration of the module 100G in which the ground electrode GND and the shield are connected in the portion of the protrusion 15 with the via 82 interposed therebetween, the via 82 is formed by the half-cutting step by using the dicer so as to be exposed on the upper surface side of the protrusion 15. At this time, in the via 82, a surface exposed on the upper surface side of the protrusion 15 comes into contact with a bottom surface of the blade of the dicing saw. Since the machinability of the bottom surface of the blade is less likely to deteriorate even though the bottom surface wears compared to the side surface of the blade, the via 82 connected to the ground electrode GND is easily exposed to the upper surface side of the protrusion 15. Accordingly, the connectivity between the ground electrode GND and the shield 30 or the shield 32 can be improved as compared with the configuration of the module 100E or the like.

(Dimension of Protrusion)

Figure 9:
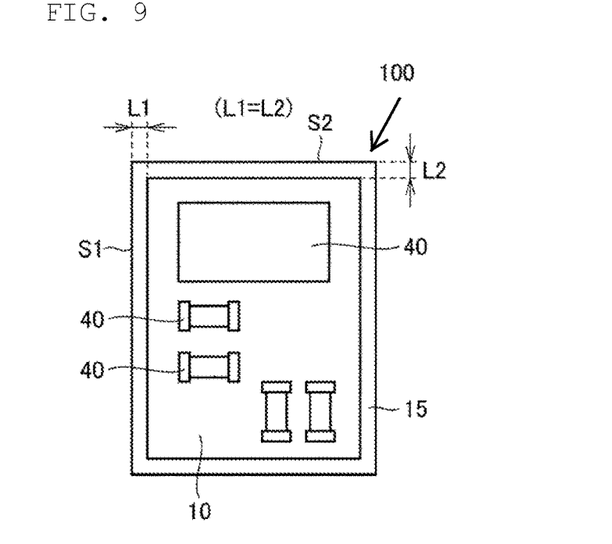
FIG. 9 is a diagram illustrating a first example of a protrusion formed on the module board.
Figure 10:
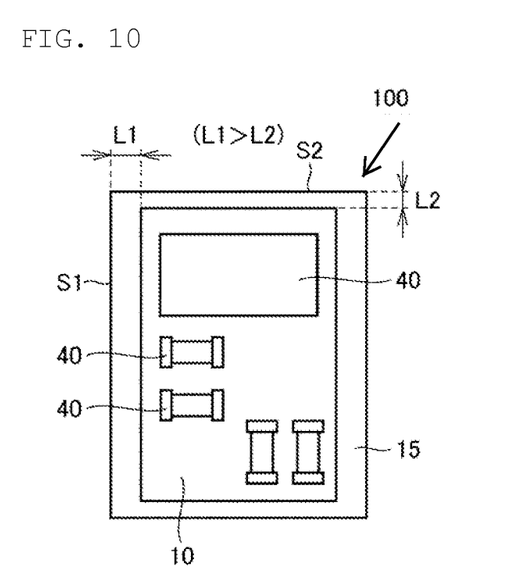
FIG. 10 is a diagram illustrating a second example of the protrusion formed on the module board.

FIGS. 9 and 10 are diagrams illustrating the module 100 illustrated in FIG. 1 as viewed in plan view from the positive direction of the Z-axis of FIG. 1. In FIGS. 9 and 10, the shield 30 and the mold portion 20 are omitted, and the electronic components 40 on the module board 10 can be visually recognized.

The module 100 has a substantially rectangular shape including a first side S1 and a second side S2 adjacent to the first side S1 when viewed in plan view. In FIG. 9, a protrusion length L1 of the protrusion 15 from the first side S1 (a side surface having the first side S1) and a protrusion length L2 of the protrusion 15 from the second side S2 (a side surface having the second side S2) have the same dimensions (L1=L2). In FIG. 10, the protrusion length L1 of the protrusion 15 from the first side S1 is larger than the protrusion length L2 of the protrusion 15 from the second side S2 (L1>L2). In other words, the protrusion length L1 of the protrusion 15 on the first side S1 is equal to or greater than the protrusion length L2 of the protrusion 15 on the second side S2.

It is preferable that a thickness of the protrusion 15 in a stacking direction (Z-axis direction in FIG. 1) is in a range of 10% or more and less than 30% of a thickness of the module board 10. For example, when the thickness of the module board 10 is 200 μm, the thickness of the protrusion is 20 μm or more and less than 60 μm. When the protrusion 15 is set to be thinner than this range, the rigidity of the protrusion 15 itself cannot be ensured, and thus, there is a possibility that the protrusion 15 is broken. On the other hand, when the thickness of the protrusion 15 increases, a ratio of the protrusion 15 on the side surface of the module board 10 increases, and the shield range on the side surface of the module board 10 is narrowed. As a result, the shield effect of the conductor patterns 80 inside the module board 10 can be reduced. Also, as illustrated in FIG. 6 or 7, when the ground electrodes GND formed inside the module board 10 are connected to the shields 30 and 32 on the side surfaces of the board, since the range of the shield on the side surfaces of the module board 10 is limited, it is difficult to connect the ground electrodes GND and the shields 30 and 32.

[Manufacturing Process of Electronic Component Module]

Next, the manufacturing process of the electronic component module described above will be described. In the following description, the case of the module 100C in which the side surfaces of the module board 10 and the upper surface side and the lower surface side of the protrusion 15 are covered with the shields 30 and 32 as described with reference to FIG. 4 will be described as an example of the manufacturing process.

Figure 11:
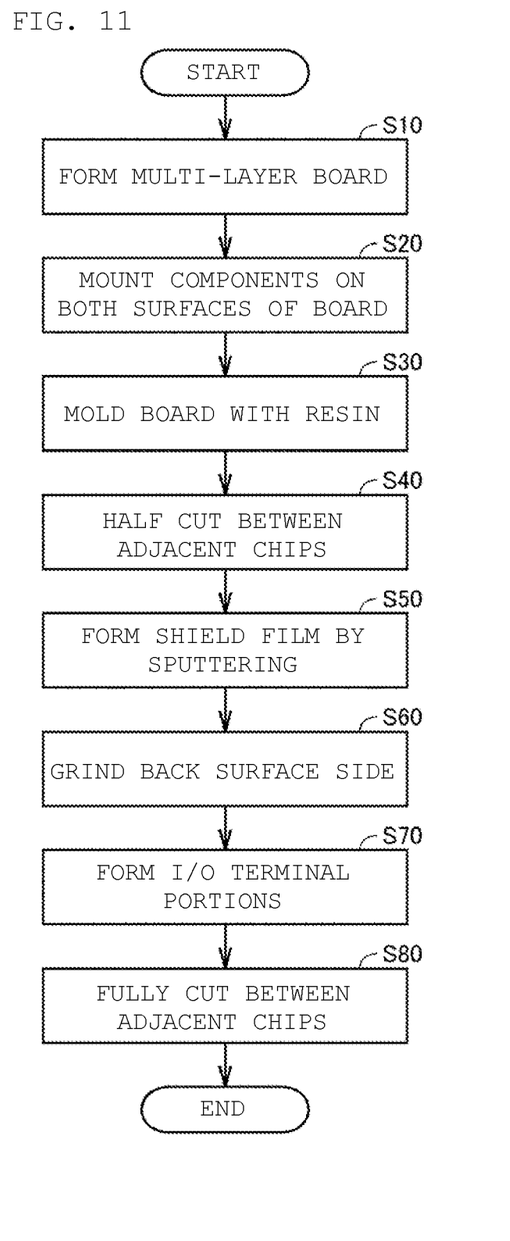
FIG. 11 is a flowchart illustrating a manufacturing process of the electronic component module according to the first embodiment.

FIG. 11 is a flowchart illustrating a manufacturing process of the module 100C according to the first embodiment.

With reference to FIG. 11, first, the module board 10 having the multi-layer structure is formed in step 10 (hereinafter, the step is abbreviated as "S"). As described above, the module board 10 is formed by using a resin board such as an epoxy resin or a liquid crystal polymer, or a ceramic board such as LTCC. The module board 10 is formed by stacking a plurality of unit boards on which a metal pattern is formed on one surface of resin or ceramics, and heating and pressure bonding the unit boards (if they are resin boards) or firing the unit boards (if they are ceramic boards). The columnar conductors 60 are formed on the formed module board 10.

Subsequently, in S20, the electronic components 40 are mounted on both the surfaces of the module board 10. Specifically, the solder bumps are formed by printing on the electrode terminals formed on the front and back surfaces of the module board 10. The electronic components 40 and the electrode terminals are coupled by mounting the electronic components 40 on the formed solder bumps and then heating and melting the solders in a reflow step. If necessary, the board may be washed after the reflow.

In a mounting step of the electronic component 40, the front surface 12 and the back surface 14 of the module board 10 may be simultaneously mounted, or the mounting of the electronic components on the other surface may be executed after the mounting of the electronic components on one surface is completed.

When the mounting of the electronic components 40 on both the surfaces of the module board 10 is completed, both the surfaces of the module board 10 are molded with resin in S30. As described above, the epoxy resin containing the silica filler can be used as the molding resin. Alternatively, alumina may be used as the filler in order to enhance heat conduction.

For example, a known method such as a compression mold, a transfer mold, a liquid resin mold, or a sheet resin mold can be used as the molding method.

In a molding step, the front and back surfaces of the module board 10 may be molded all at once, or may be molded one by one. If necessary, the module board 10 may be plasma-washed before the molding step.

After the molding step, the mold portion 22 on the back surface side of the module is ground by using a grinder to expose the columnar conductor 60 from the mold portion 22 such that I/O terminal portions for mounting the module on another board can be formed.

Thereafter, in S40, the chips of the adjacent modules are half cut by using the dicer, a laser cutter, or the like. The half-cutting is a step of forming cuts from the front surface side and the back surface side of the module board 10 to the middle of the module board 10. The portion remaining without being cut by this half-cutting becomes the protrusion 15. When the thickness of the protrusion 15 increases, since the rigidity of the protrusion 15 increases, the protrusion 15 can be prevented from being broken during the handling of the board in the manufacturing process. On the other hand, when the thickness of the protrusion 15 is reduced, since an area covered with the shields on the side surfaces of the module board 10 increases, the shielding effect of the whole module can be improved.

When the half-cutting is performed by using the dicing saw, for example, a dicing saw having a blade width of 0.1 mm or more and less than 1.0 mm can be used. When the shields are formed by sputtering in the subsequent process, as the blade width becomes wider, the sputtering adhesion is improved. On the other hand, when a dicing saw having a narrower blade width is used, since the amount of cutting can be reduced, the number of modules manufactured from one board can be increased, and thus, the yield can be increased.

In the half-cutting, a depth of the cut from the front surface side and a depth of the cut from the back surface side of the module board 10 may be equal or different.

When the half-cutting step is completed, the shield films are formed on the front and back surfaces of the module by sputtering in S50. The shield films may be formed as a plurality of sputtered films, and can be formed as, for example, three layers of an adhesion layer, a conductive layer, and a corrosion resistant layer.

A thickness of the shield film can be, for example, 2 µm or more and less than 5 µm. It is preferable that the portions where the protrusions 15 are formed are formed to be thicker than the shield films formed on the side surfaces of the module board 10. In a division step into the modules to be described later, since the protrusions 15 are fully cut, the rigidity is increased by setting the shield films of the portions of the protrusions 15 to be thicker, the shield films are less likely to be peeled off from the protrusions 15 at the time of full-cut. The full-cut is a step of cutting from the upper surface side to the lower surface side of the protrusions 15 such that there is no uncut portion.

Subsequently, in order to form the I/O terminal portions for mounting the module on another board, the shield films are removed by grinding the back surface side of the module by using the grinder in S60 to expose the mold portion 22 and the columnar conductor 60 on the back surface side of the module board 10.

The electrode terminals 70 are electrically connected to the columnar conductors 60 on the back surface side of the mold portion 22, and thus, the I/O terminal portions (input and output terminal portions) are formed (S70).

In S80, the portions where the protrusions 15 are formed by the half-cutting are fully cut by using the dicer or the laser, and thus, the adjacent chips are separated. Accordingly, the electronic component module is completed.

FIGS. 12A to 14C are sectional views illustrating the details of the manufacturing process described with reference to FIG. 11. The manufacturing process proceeds in the order of FIGS. 12A, B, C, 13A, B, C, and 14A, B, C.

Figure 12A:
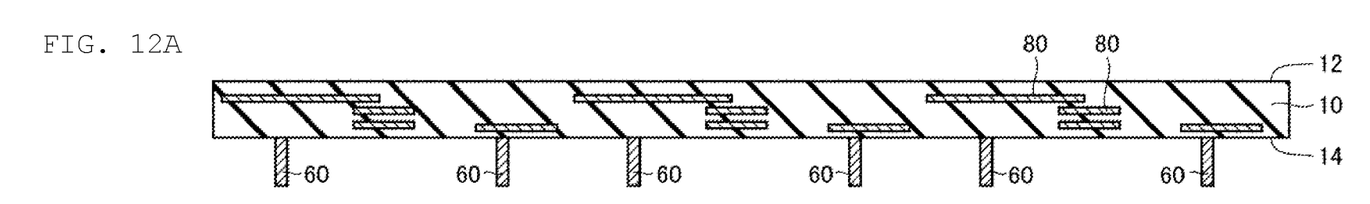

Referring to FIG. 12A, the module board 10 having the multi-layer structure is first formed as described in S10 of FIG. 11. The conductor patterns 80 for forming the wiring patterns, the ground electrodes, the inductors, or the capacitors are formed inside the module board 10. The columnar conductors 60 are formed on the back surface 14 side of the module board 10.

Figure 12B:
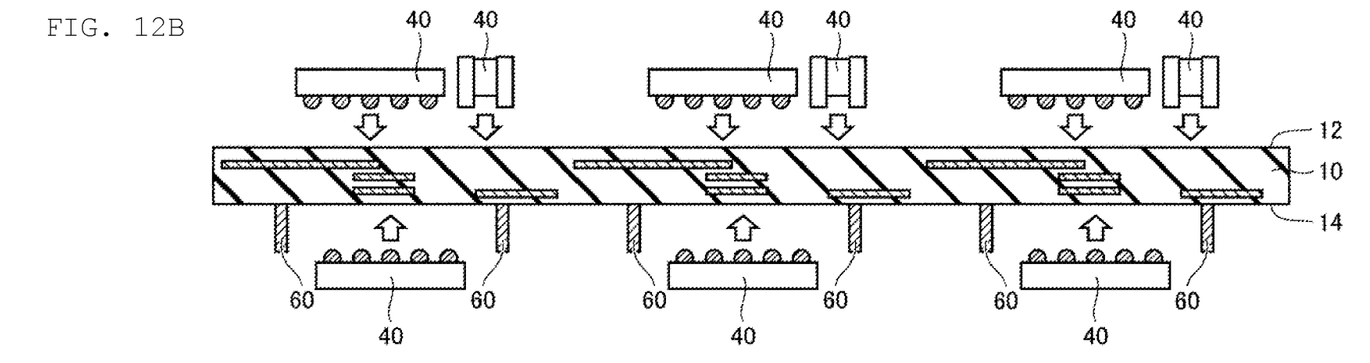
Figure 12C:
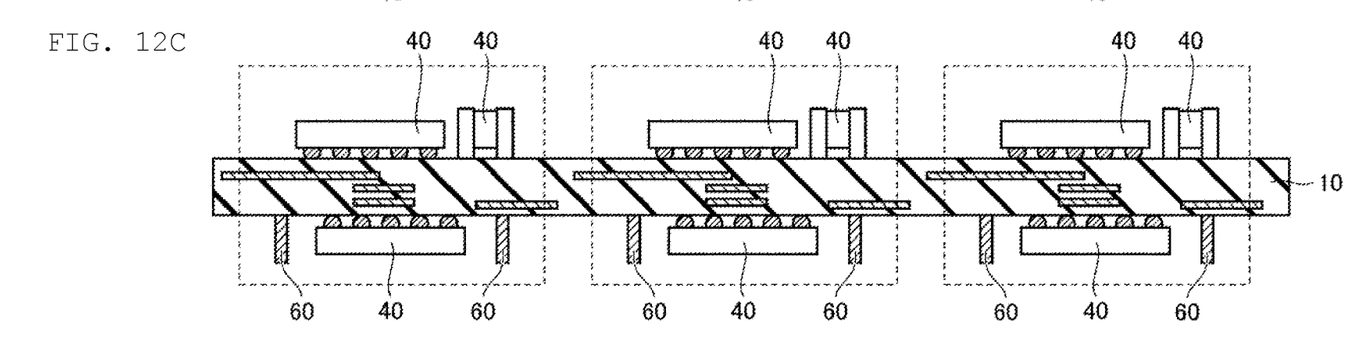

When the module board 10 is formed, the electronic components 40 are mounted on the front surface 12 and the back surface 14 of the module board 10 as illustrated in FIG. 12B (S20 in FIG. 11). FIG. 12C illustrates a state in which the mounting of the electronic components 40 is mounted on the module board 10. In FIG. 12C, a portion surrounded by a broken line is a portion that becomes one electronic component module. In this example, three modules are manufactured from one board.

Figure 13A:
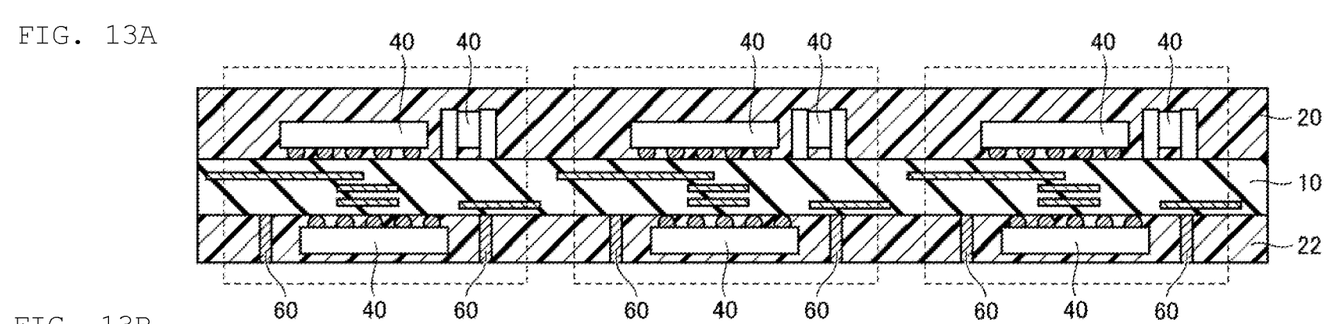

Subsequently, referring to FIG. 13A, the mold portions 20 and 22 are formed on the front and back surfaces of the module board 10 by using the molding resin so as to cover the electronic components 40 (S30 in FIG. 11). The mold portion 22 on the back surface 14 side is ground by the grinder to expose the columnar conductors 60 from the mold portion 22.

Figure 13B:
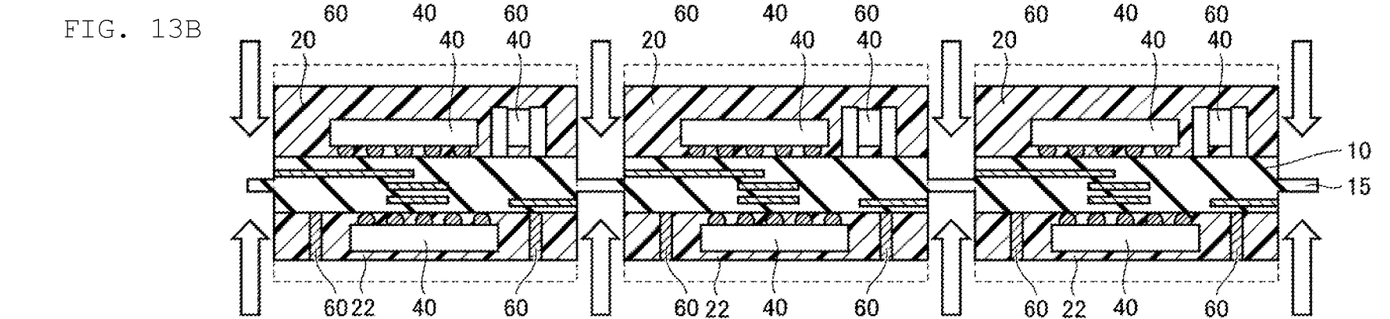

Thereafter, as illustrated in FIG. 13B, the half-cutting is performed from the front surface side and the back surface side by using the dicer such that a part of the module board 10 remains between the adjacent modules (S40 in FIG. 11). The ends of the board are also half cut. Accordingly, the protrusions 15 of the module board 10 are formed. At this time, the end surfaces of the ground electrodes GND formed inside the module board 10 are exposed to the half-cut portion on the side surfaces of the module board 10.

Figure 13C:
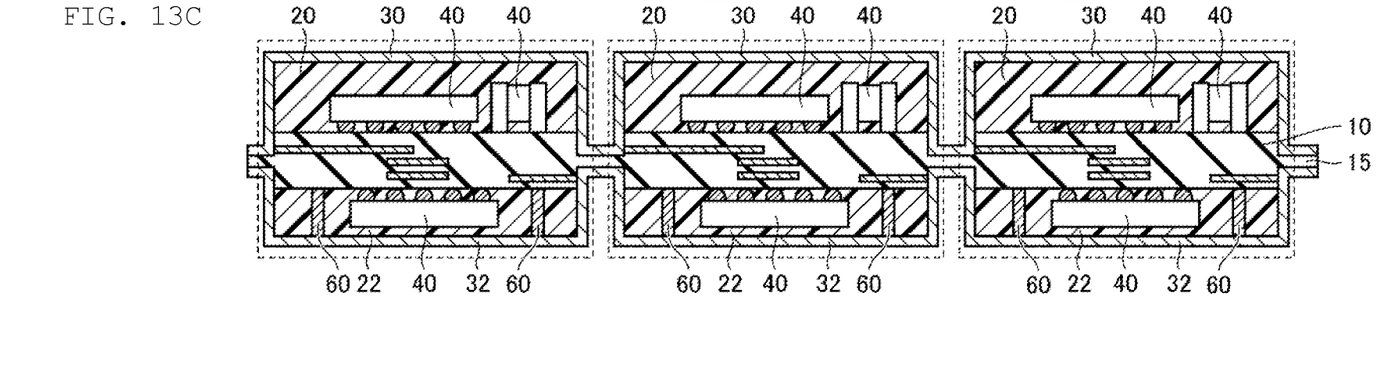

As illustrated in FIG. 13C, the shield films are formed on the front and back surfaces of the module by using sputtering (S50 in FIG. 11). In this step, the upper surface and the side surfaces of the mold portion 20, the lower surface and the side surfaces of the mold portion 22, the side surfaces of the module board 10, and the upper surface side and the lower surface side of the portion of the module board 10 remaining in the half-cutting are covered with the shield 30 or the shield 32. At this time, the ground electrodes GND exposed on the side surfaces of the module board 10 are electrically connected to the shields 30 and 32.

Figure 14A:
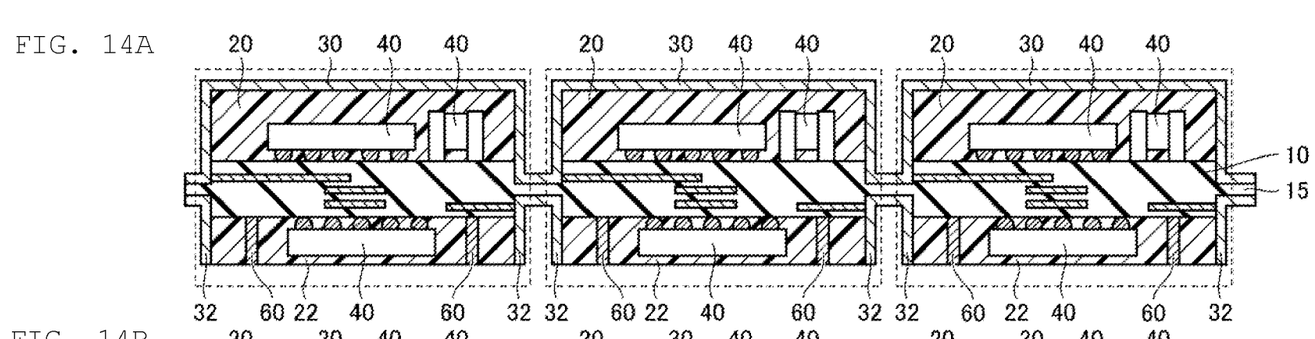
Figure 14B:
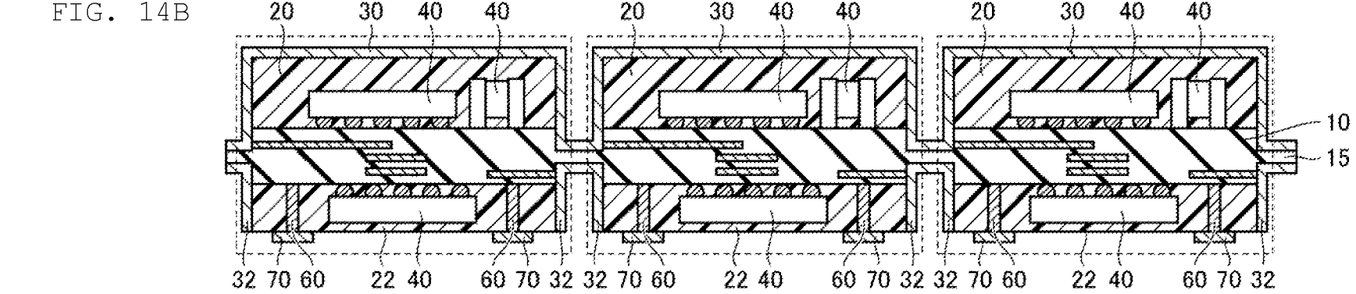

Subsequently, when the shield films are formed, the shield 32 on the lower surface side of the module is ground by the grinder as illustrated in FIG. 14A (S60 in FIG. 11). Accordingly, the mold portion 22 is exposed. The I/O terminal portions are formed by electrically connecting the electrode terminals 70 to the columnar conductors 60 exposed from the mold portion 22 (FIG. 14B, S70 in FIG. 11).

Figure 14C:
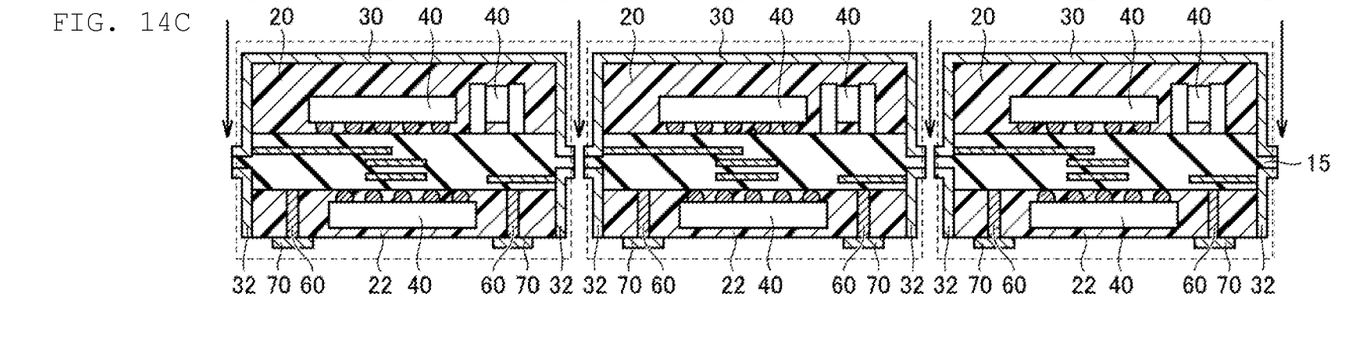

Finally, the portions of the protrusions 15 are fully cut, and the chips of the adjacent modules are separated from each other (S80 in FIG. 11). Accordingly, the chips for individual electronic component modules are completed (FIG. 14C).

By manufacturing the electronic component module according to the manufacturing process described above, in the electronic component module in which the electronic components are mounted on both the surfaces of the module board, the shield covering the upper surface of the module and the shield covering the lower surface are separated by the protrusions protruding from the side surfaces of the module board. Accordingly, the electromagnetic waves generated in the electronic components mounted on one surface of the module board can be prevented from being transmitted to the electronic components mounted on the other surface through the shields. Accordingly, it is possible to effectively suppress EMI by such a shield structure.

Second Embodiment

The configuration in which the electronic components are mounted on both the front surface and the back surface of the module board has been described in the electronic component module of the first embodiment.

In a second embodiment, an example of a configuration in which an antenna circuit is disposed on the front surface of the module board and the electronic components are mounted on the back surface will be described.

Figure 15:
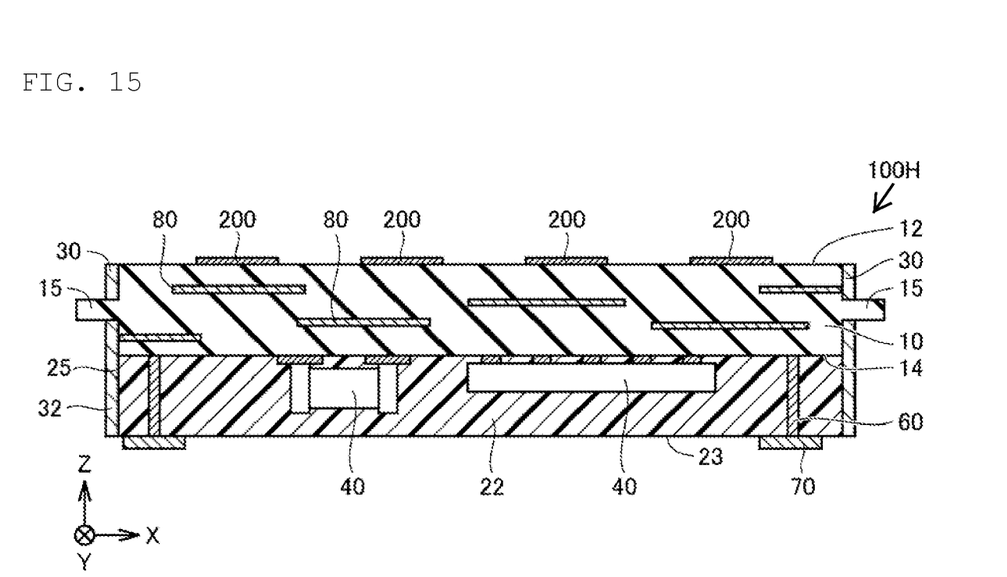
FIG. 15 is a sectional view of an electronic component module according to a second embodiment.

FIG. 15 is a sectional view of an electronic component module 100H according to the second embodiment. In the electronic component module 100H, the elements overlapping those of the electronic component module 100 of the first embodiment illustrated in FIG. 1 will not be repeated.

Referring to FIG. 15, in the electronic component module 100H, a plurality of antenna circuits 200 is formed on the front surface 12 side of the module board 10 instead of the electronic components 40. The electronic component module 100H has a configuration in which the mold portion 20 on the front surface 12 side and the shield 30 covering the mold portion 20 are removed. The antenna circuits 200 may be covered with the mold portion 20.

In the electronic component module 100H, the transmission of the electromagnetic waves generated in the antenna circuits 200 to the electronic components 40 mounted on the back surface 14 through the shields 30 and 32 can be suppressed by the protrusions 15 formed on the side surfaces of the module board 10. Accordingly, it is possible to effectively suppress EMI.

Figure 16:
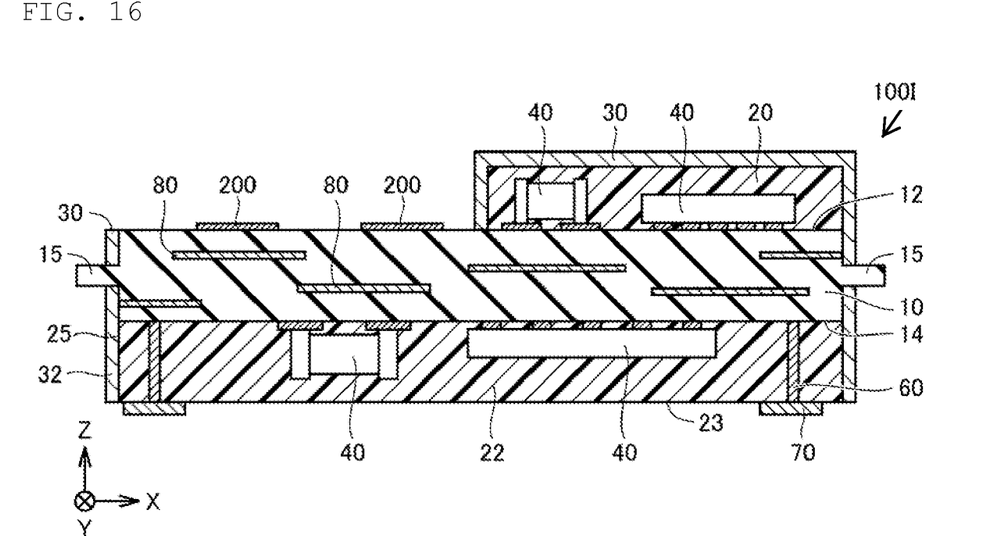
FIG. 16 is a sectional view of an electronic component module according to a modification example of the second embodiment.

The electronic components 40 may be mounted on the front surface 12 of the module board 10 in addition to the antenna circuits 200, as in an electronic component module 100I of a modification example illustrated in FIG. 16. In this case, the electronic components 40 are covered with the mold portion 20 and the shield 30. Even in such a configuration, the transmission of the electromagnetic waves generated in the antenna circuit 200 and the electromagnetic waves generated in the electronic components 40 mounted on the front surface 12 side to the back surface 14 side with the shields 30 and 32 interposed therebetween can be suppressed by the protrusions 15 formed on the side surfaces of the module board 10. Thus, EMI can be effectively suppressed.

Third Embodiment

In each of the electronic component modules illustrated in the first embodiment and the second embodiment, the configuration in which the module board is connected to the external mounting board by using the electrode terminals 70 disposed on the back surface side has been described. In a third embodiment, a configuration in which a connector is used for connection with the mounting board will be described.

Figure 17:
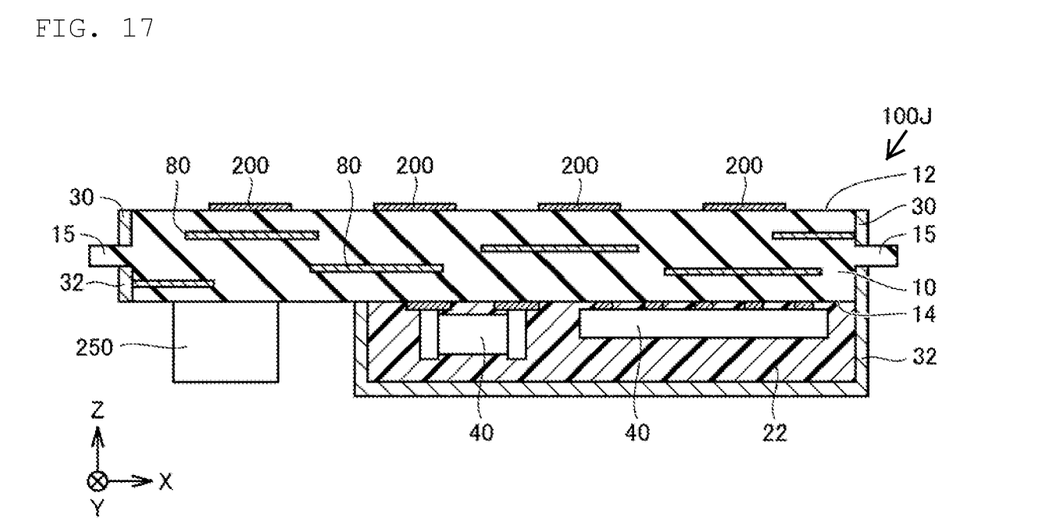
FIG. 17 is a sectional view of an electronic component module according to a third embodiment.

FIG. 17 is a sectional view of an electronic component module 100J according to the third embodiment. In the electronic component module 100J, a connector 250 is disposed on the back surface 14 side of the module board 10 in the electronic component module 100H of the second embodiment, and the electrode terminals 70 and the columnar conductors 60 are removed. In the electronic component module 100J, the description of the elements overlapping those of the electronic component module 100H will not be repeated.

Referring to FIG. 17, in the electronic component module 100J, the antenna circuits 200 are formed on the front surface 12 side of the module board 10. The electronic components 40 are mounted and the connector 250 for connection with the external board is disposed on the back surface 14 side of the module board 10. The electronic components 40 are covered with the mold portion 22 and the shield 32. On the other hand, the connector 250 is not covered with the mold portion 22 and the shield 32.

As stated above, in the configuration in which the connector is disposed as a connection terminal with the external board, the transmission of the electromagnetic waves generated in the antenna circuits 200 to the electronic components mounted on the back surface side through the shields can also be suppressed by the protrusions 150 formed on the side surfaces of the module board 10, and thus, EMI can be effectively suppressed.

Figure 18:
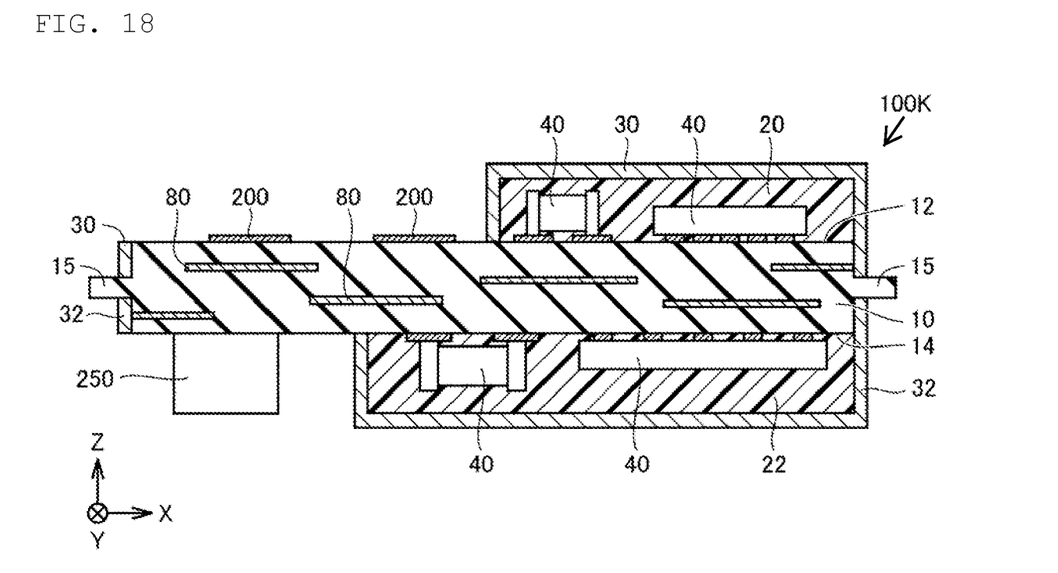
FIG. 18 is a sectional view of an electronic component module according to a modification example of the third embodiment.

As with FIG. 16, the electronic components 40 may be mounted on the front surface 12 side of the module board 10 in addition to the antenna circuits 200 as in an antenna module 100K of a modification example of FIG. 18.

The description of the currently disclosed embodiments is illustrative in all respects, and should not be considered as limiting. The scope of the present disclosure is illustrated by the claims rather than the description of the embodiments described above, and is intended to include all modifications within the meaning and scope equivalent to the claims.

10: Module board
12: Front surface
14: Back surface
15, 15A: Protrusion
20, 22: Mold portion
21: Upper surface
23: Lower surface
24, 25: Side surface
26: End surface
30, 32: Shield
40: Electronic component
42: Solder bump
60: Columnar conductor
82: Via
70: Electrode terminal
80: Conductor pattern
100, 100A to 100K: Electronic component module
200: Antenna circuit
250: Connector
GND: Ground electrode
S1, S2: Side

The invention claimed is:

1. An electronic component module comprising:
   a module board having a first surface, a second surface facing the first surface, and side surfaces connecting the first surface and the second surface;
   electronic components mounted on at least one of the first surface and the second surface;
   mold portions covering the electronic components; and
   a shield covering at least a part of the mold portions and the side surfaces,
   wherein protrusions protruding from the side surfaces are provided on the module board, and
   the shield is separated by the protrusions,
   wherein end surfaces of the protrusions are not covered with the shield, and exposed.

2. The electronic component module according to claim 1, wherein
   the module board has a multi-layer structure, and has ground electrodes provided inside, and
   the ground electrodes are electrically connected to the shield.

3. The electronic component module according to claim 2, wherein the ground electrodes are electrically connected to the shield on the side surfaces.

4. The electronic component module according to claim 2, wherein the ground electrodes are electrically connected to the shield at boundary portions between the side surfaces and the protrusions.

5. The electronic component module according to claim 1, wherein, in the protrusions, at least a part of surfaces in contact with the side surfaces of the module board is covered with the shield.

6. The electronic component module according to claim 5, wherein, in the shield, a thickness of a part of the shield covering the protrusions is more than a thickness of a part of the shield covering the side surfaces of the module board.

7. The electronic component module according to claim 1, wherein end surfaces of the protrusions are not covered with the shield.

8. The electronic component module according to claim 1, wherein the electronic components are mounted on the first surface and the second surface, respectively, and the mold portions are provided on both the first surface and the second surface.

9. The electronic component module according to claim 1, wherein, a thickness of each of the protrusions in a stacking direction is 10% or more of a thickness of the module board, and is less than 30% of the thickness of the module board.

10. The electronic component module according to claim 1, wherein the protrusions are provided at a same distance from the first surface over a whole circumference of the side surfaces.

11. The electronic component module according to claim 1, further comprising an antenna circuit disposed on at least one of the first surface and the second surface.

12. The electronic component module according to claim 1, further comprising a connector disposed on at least one of the first surface and the second surface, wherein the connector functions as a connection terminal.

13. A method for manufacturing an electronic component module, comprising steps of:
    forming a module board having a first surface, a second surface facing the first surface, and side surfaces connecting the first surface and the second surface;
    mounting at least one electronic component on at least one of the first surface and the second surface;
    molding the mounted electronic component;
    half cutting the module board having the electronic component molded;
    forming a shield on the half-cut module; and
    fully cutting the module board on which the shield is formed at a half-cut portion,
    wherein protrusions protruding from the side surfaces are provided on the module board, and
    the shield is separated by the protrusions,
    wherein end surfaces of the protrusions are not covered with the shield, and exposed.

14. The electronic component module according to claim 2, wherein end surfaces of the protrusions are not covered with the shield.

15. The electronic component module according to claim 3, wherein end surfaces of the protrusions are not covered with the shield.

16. The electronic component module according to claim 4, wherein end surfaces of the protrusions are not covered with the shield.

17. The electronic component module according to claim 5, wherein end surfaces of the protrusions are not covered with the shield.

18. The electronic component module according to claim 6, wherein end surfaces of the protrusions are not covered with the shield.

19. The electronic component module according to claim 2, wherein
    the electronic components are mounted on the first surface and the second surface, respectively, and
    the mold portions are provided on both the first surface and the second surface.

20. The electronic component module according to claim 3, wherein
    the electronic components are mounted on the first surface and the second surface, respectively, and
    the mold portions are provided on both the first surface and the second surface.

* * * * *